US010408876B2

United States Patent
Ziaja et al.

(10) Patent No.: US 10,408,876 B2
(45) Date of Patent: Sep. 10, 2019

(54) MEMORY CIRCUIT MARCH TESTING

(71) Applicant: ORACLE INTERNATIONAL CORPORATION, Redwood City, CA (US)

(72) Inventors: Thomas Ziaja, Austin, TX (US); Lancelot Kwong, Fremont, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 76 days.

(21) Appl. No.: 15/882,674

(22) Filed: Jan. 29, 2018

(65) Prior Publication Data

US 2019/0235019 A1   Aug. 1, 2019

(51) Int. Cl.
   *G01R 31/3177* (2006.01)
   *G01R 31/317* (2006.01)
   (Continued)

(52) U.S. Cl.
   CPC ..... *G01R 31/3177* (2013.01); *G01R 31/3183* (2013.01); *G01R 31/31722* (2013.01);
   (Continued)

(58) Field of Classification Search
   CPC .......... G01R 31/3177; G01R 31/31722; G01R 31/31724; G01R 31/318555; G01R 31/31813; G01R 31/3183
   (Continued)

(56) References Cited

U.S. PATENT DOCUMENTS 5,311,520 A * 5/1994 Raghavachari ........ G11C 29/16
                                                    714/719
5,469,445 A * 11/1995 Nicolaidis ...... G01R 31/318527
                                                    714/718

(Continued)

OTHER PUBLICATIONS

Gayathr et al., Methodology to Detect and Diagnose Faults in Memories using BIST, Aug. 2015, International Journal of Advanced Research in Computer and Communication Engineering, vol. 4, Issue 8, pp. 24-33. (Year: 2015).*

(Continued)

*Primary Examiner* — John J Tabone, Jr.
(74) *Attorney, Agent, or Firm* — Marsh Fischmann & Breyfogle LLP; Jonathon A. Szumny; Kent A. Lembke (57) ABSTRACT

Embodiments include novel approaches for scan-based device testing using a march controller. A march data store can have sets of march element data stored thereon, each defining a respective march element of a march test sequence. A march select register can select each stored set of march element data according to the predefined march test sequence, and a march data loader can iteratively and sequentially output each set of march element data selected by the march select register. A memory built-in self-test controller can generate, in response to receiving each set of march element data output by the march controller, test stimulus data corresponding to the received set of march element data. The test stimulus data can input to a scan chain of the integrated circuit under test, and response data can be captured from the scan chain and assessed to determine whether the integrated circuit passed the test.

23 Claims, 4 Drawing Sheets

(51) Int. Cl.
    *G01R 31/3181*    (2006.01)
    *G01R 31/3185*    (2006.01)
    *G01R 31/3183*    (2006.01)

(52) U.S. Cl.
    CPC . *G01R 31/31724* (2013.01); *G01R 31/31813* (2013.01); *G01R 31/318555* (2013.01)

(58) Field of Classification Search
    USPC ............... 714/727, 726, 729, 718, 719, 720; 365/200, 201
    See application file for complete search history.

(56) References Cited

U.S. PATENT DOCUMENTS

| | | | | |
|---|---|---|---|---|
| 6,560,740 | B1* | 5/2003 | Zuraski, Jr. | G01R 31/3187 714/727 |
| 6,907,555 | B1* | 6/2005 | Nomura | G11C 29/44 714/719 |
| 7,222,272 | B2* | 5/2007 | Takazawa | G11C 29/26 714/702 |
| 7,353,442 | B2* | 4/2008 | Bahl | G11C 29/006 365/201 |
| 7,426,668 | B2* | 9/2008 | Mukherjee | G01R 31/31724 365/201 |
| 7,428,680 | B2* | 9/2008 | Mukherjee | G01R 31/31724 714/718 |
| 7,434,131 | B2* | 10/2008 | Mukherjee | G01R 31/31724 714/718 |
| 7,502,976 | B2* | 3/2009 | Ross | G11C 29/1201 365/201 |
| 7,831,871 | B2* | 11/2010 | Ross | G11C 29/1201 365/200 |
| 8,145,958 | B2* | 3/2012 | Aitken | G11C 29/16 365/200 |
| 8,209,572 | B2* | 6/2012 | Ross | G11C 29/1201 714/718 |
| 9,401,223 | B2* | 7/2016 | Ziaja | G11C 29/12 |
| 2002/0194558 | A1* | 12/2002 | Wang | G01R 31/318547 714/718 |
| 2003/0221146 | A1* | 11/2003 | Flynn | G11C 29/16 714/718 |
| 2004/0190331 | A1* | 9/2004 | Ross | G11C 29/1201 365/154 |
| 2005/0193293 | A1* | 9/2005 | Shikata | G11C 29/028 714/718 |
| 2006/0146622 | A1* | 7/2006 | Mukherjee | G01R 31/31724 365/201 |
| 2006/0156133 | A1* | 7/2006 | Mukherjee | G01R 31/31724 714/733 |
| 2006/0156134 | A1* | 7/2006 | Mukherjee | G01R 31/31724 714/733 |
| 2007/0106923 | A1* | 5/2007 | Aitken | G11C 29/16 714/718 |
| 2009/0125763 | A1* | 5/2009 | Chang | G01R 31/318552 714/719 |
| 2009/0172486 | A1* | 7/2009 | Ross | G11C 29/1201 714/729 |
| 2011/0145774 | A1* | 6/2011 | Ross | G11C 29/1201 716/112 |
| 2013/0163356 | A1* | 6/2013 | Yanagida | G11C 29/40 365/200 |
| 2015/0325314 | A1* | 11/2015 | Ziaja | G11C 29/12 365/189.02 |

OTHER PUBLICATIONS

Molyneaux et al., Design for Testability Features of the Sun Microsystems Niagara2 CMP/CMT SPARC Chip, 2007, IEEE, pp. 1-8 (Year: 2007).*

* cited by examiner

MEMORY CIRCUIT MARCH TESTING

FIELD

Embodiments relate generally to memory circuits, and, more particularly, to march testing of memory circuits.

BACKGROUND

Memory arrays on integrated circuits may be tested using different test mechanisms. One such mechanism is a memory built-in self-test (MBIST). Memory testing using this mechanism is implemented with a controller that is coupled to the memory array (or arrays) to be tested. The controller may generate various types of test patterns in which data is written to and read from the memory, wherein the reading of data may be used to verify whether or not the memory passes a given test. The controller may convey signals to the memory over address lines, data lines, and control lines (e.g., read enable, write enable, bank enable), and may receive signals over data lines as well. Thus, the controller may test the functionality of the entire memory array, including address and control circuitry, as well as testing individual memory cells. The controller may also provide signals to devices external to the integrated circuit in which the memory array is implemented in order to indicate the results of a particular test.

Scan testing is another mechanism that may be used in memory testing. Scan chains may be formed around the inputs and outputs of the memory array. Test input data may be shifted into the scan chain. After the shifting of input data is complete, one or more capture cycles are conducted to allow data to be written into and read from the memory array. The data read from the memory array (test output data) may then be shifted, via the scan chain, from the integrated circuit in which the memory array is implemented. The test output data may then be analyzed by a test system to determine whether the particular test passed or failed. In many cases, the speed at which scan testing of memory arrays is conducted may be significantly lower than the speed at which the integrated circuit is intended to operate.

BRIEF SUMMARY

Among other things, embodiments provide systems and methods for scan-based device testing using a novel march controller. For example, embodiments can perform scan-based testing of an integrated circuit in a test environment or in an operating environment. Embodiments include a march controller with a march data store, a march select register, and a march data loader. The march data store has sets of march element data stored thereon, each defining a respective march element of a march test sequence. The march select register can select each set of march element data from the march data store according to the predefined march test sequence, and the march data loader can iteratively and sequentially output each set of march element data selected by the march select register. A memory built-in self-test controller can generate, in response to receiving each set of march element data output by the march controller, test stimulus data corresponding to the received set of march element data. The test stimulus data can be input to a scan chain of the integrated circuit under test, and response data can be captured from the scan chain and assessed to determine whether the integrated circuit passed the test.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Designing and implementing integrated circuits involves testing structures and other components within the circuits. For example, memory circuits (e.g., static random access memory, or SRAM, circuits) typically include large arrays of structures that can be tested in various ways that are generally complex. One type of testing involves implementing memory built-in self test (MBIST) logic. For example, an MBIST engine can provide an interface in a test mode between SRAM blocks of the integrated circuit and an external tester controller, such as automated test equipment (ATE). Another type of testing is scan-based testing. Such testing generally forms scan chains around inputs and outputs of the memory array, shifts test input data into the scan chain, and captures resulting test output data received from the array. The test output data can be analyzed to determine whether the particular test passed or failed (e.g., by comparing the output to an expected output).

Testing of memories (e.g., SRAMs) relies on specific test patterns for both test coverage and circuit characterization. An accepted industry standard is the so-called "13N" march test, which can be characterized as follows:

$$\hat{\ }(w0)\hat{\ }(r0w1r1)\ v(r1w0r0)\ v(r0w1r1)\hat{\ }(r1w0r0)$$

In this characterization, "^( )" indicates an up-counting march across the SRAM address space, "v( )" indicates a down-counting march across the SRAM address space, "wN" represents a write of a "0" or "1" data input pattern, and "rN" represents a read of a "0" or "1" data input pattern. The above test is called "13N" to indicate that it includes 13 writes or reads. In some cases, the test pattern can be augmented with additional patterns. One example of a "14N" march test pattern used in industry seeks to enhance the 13N pattern for read-after-write worst case weak bit testing, as follows:

$$\hat{\ }(w1)\hat{\ }(w0w1*r0r1*r0w1)\ v(w0)\ v(w1w0*r1r0*r1w0)$$

The "*" represents an address star. The combination of the above 13N and 14N test patterns can yield a highly effective march test, particularly for statistical process control (SPC) and system on a chip (SOC) repairable SRAMs.

Currently, most SRAMs rely on MBIST to apply the 13N test patterns (e.g., and/or other patterns). The MBIST approach uses logic external to the SRAM under test, which can involve extensive routing overhead from the MBIST engine, including staging to and from the SRAM to apply the test and from the SRAM to the compare structures for the data output. Additionally, such external MBIST engines typically are timed at a standard logic frequency target, as it can be difficult to separately time their logic and the paths to and from the SRAM; while the SRAMs are timed to work at least +10% over those targets to adequately test and characterize them. Such a timing differential can lead to sub-optimal SRAM test and characterization, as the external logic often fails before the SRAM has reached its timing limits.

Accordingly, some designs have attempted to move the MBIST logic into the SRAM and to use existing scan routing. However, such scan-based engines tend not to really be built-in, as implementing the scan-based engine can rely on many scan patterns to program the scan-based engine and apply the test. For example, the industry-standard 13N march test (described above) includes one write sequence and four read-write-read sequences (each sequence termed a march element), which relies on at least five scan patterns per SRAM under test. Adding the 14N march test (also described above) creates a 27N march test with nine march elements, which relies on at least nine scan patterns per SRAM under test. A further complication with scan-based engines is that implementing such patterns typically involves identifying individual flop positions in the scan pattern to program the scan-based engine. Such identifying would be involved in each of the scan patterns (e.g., each of the five scan patterns of the 13N march test) across all SRAMs under test. These flop positions are used to implement the various read, write and data combinations of each of the march elements. Because the ordering of flop positions in a scan chain is often unconstrained (e.g., to allow for more efficient scan routing), it is often not feasible to place the user-programmed flops in the same position in the SRAM scan chain to facilitate programming. As such, appreciable effort can be expended in identifying all bit positions as part of the scan-based testing. The flop identification and programming of the scan-based engines (one per SRAM) can become particularly costly and burdensome when repeated over larger numbers of SRAMs under test. For example, a typical core can include around 40-50 SRAMs, and testing can involve individually programming each for each scan-based MBIST march element. Thus, to run one default 27N march test across such a core can involve at least 40*9 (i.e., 9 march elements times 40 SRAMs), or 360, scan patterns.

Figure 1:
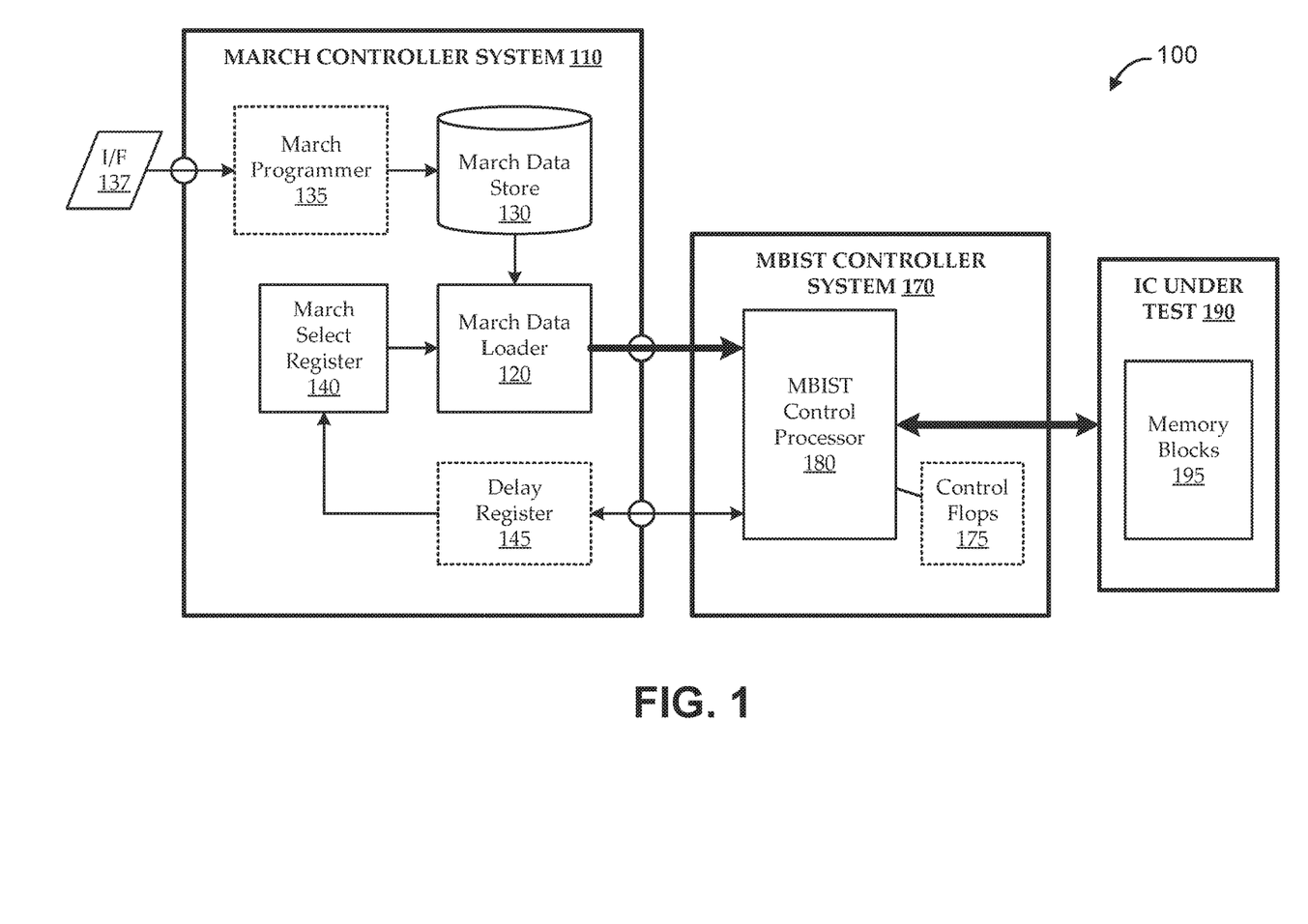
FIG. 1 shows a block diagram of an illustrative integrated circuit march testing environment, according to various embodiments.

FIG. 1 shows a block diagram of an illustrative integrated circuit march testing environment 100, according to various embodiments. The environment 100 includes a novel march controller 110 that operates to drive an entire march test for an integrated circuit (IC) under test 190 (e.g., a scanned MBIST march test of a memory integrated circuit) via a scanned MBIST controller 170. In some embodiments, the march controller 110 is a dedicated hardware processor. In other embodiments, the march controller 110 is a state machine. In other embodiments, the march controller 110 is implemented as part of the MBIST controller 170. The IC under test 190 can be any suitable IC for which a scanned march test can be used to test the functionality of the IC. In some cases, the IC under test 190 is a memory chip or other chip with regular structures. Typically, the IC under test 190 includes a number of blocks under test 195, such as a core processor having a number of SRAM blocks to be tested using the scanned MBIST testing. Though descriptions herein refer specifically to memory circuits in general, and SRAMs in particular, such references are not intended to limit the use of embodiments to other suitable circuit testing contexts. The MBIST controller 170 can be any suitable controller for interfacing with the IC under test 190 to load in scan patterns (e.g., via a multiple input shift register (MISR), or the like) to the various blocks under test 195 and to read out response data from the blocks under test 195 (e.g., a memory array) to determine whether the IC under test 190 appears to be operating properly. The MBIST controller 170 includes a MBIST control processor 180, and may optionally include one or more control flops 175, as described below. Some embodiments of suitable MBIST controllers 170 are described in U.S. Pat. No. 8,065,572, titled "At-Speed Test of Memory Arrays Using Scan," which is incorporated by reference herein in its entirety.

As illustrated, the march controller 110 can include a march data loader circuit 120, a march data store 130, and a march select register 140. Some embodiments can further include a delay register 145 and/or a march programming interface circuit 135. Embodiments of the march controller 110 can provide programming sequences for scanned MBIST march testing of the IC under test 190. For example, the march controller 110 can include a novel state machine to implement the 27N march test described above, or any other suitable march test. Embodiments can use a chip ATE tester transition test mode of the IC under test 190 without relying on user programming of the blocks under test 195. For example, implementations can use a single scan test pattern consisting of all 0's to run through an entire (e.g., 13N, 27N, etc.) march test.

Such an approach can provide a number of features. For example, as described above, applying a 27N march test to a core with 40 SRAMs using typical scan-based MBIST testing can involve identifying flop positions in the scan chain for each SRAM and programming each SRAM under test with scan patterns, resulting in around 360 patterns. Using the march controller 110, the same march test can be applied to the same core using a single scan pattern and without identifying any flop positions (e.g., all 0's can be loaded) of individual blocks under test 195, making pattern generation and application of such testing effectively trivial.

Some implementations facilitate user-mode programming of at least a subset of the SRAM flops via scan, for example, to augment a default SRAM march test. For example, instead of programming the entire MBIST controller 170 according to the march test, implementations can include programming of a data-in and a MISR seed value only once for all marches (e.g., all nine marches of the 27N march test described above). By setting other flop bit positions, embodiments described herein can facilitate user control of other logic via scan at the same time for various other tests, such as multiple port interactions. Further, embodiments described herein can permit interleaving of scan patterns with the default (all '0') scan to achieve additional testing, such as for testing content-addressable memories (CAMs).

Features of the march controller 110 can reduce test time and test cost, which can in turn reduce chip cost. Increases in chip complexity and numbers of SRAMs to test on a chip (i.e., blocks under test 195 on a particular IC under test 190) have tended to cause increases in testing costs. For example, the number of test patterns can result in increased test time, thereby becoming a primary driver of cost. Also, due to limited memory capacity, testing generally involves frequent reloading of the tester memory to apply more patterns; and reloading the tester memory can be time-consuming (e.g., taking 20 minutes per reload). Accordingly, increasing the number of test patterns in march tests can cause an appreciable increase in SRAM test time. Embodiments described herein can reduce the number of test patterns (e.g., from hundreds of patterns to a single pattern), thereby appreciably reducing the time and cost involved in such SRAM testing. For example, embodiments can start from inputs of all '0's (e.g., as compared to complex, chip-specific patterns with individual flop setting, as in conventional approaches), can end with a single-pattern scan-out result (e.g., as compared to hundreds, as in conventional approaches), and can run in parallel across all the blocks under test 195 (e.g., as compared to running in series for each SRAM, as in conventional approaches).

Further, embodiments can appreciably simplify generation of complex march patterns for SRAM test and characterization, while providing a very high test coverage. This simplification can reduce silicon bring-up, debug, and SRAM characterization time. For example, facilitating running a 27N march test across many SRAMs without initial programming, while also interleaving with other transition test patterns, can permit SRAMs to be thoroughly tested with very simple scan test patterns even at time zero of initial wafer testing. In a laboratory setting, initial silicon bring up can be enhanced by running SRAM 27N march tests without programming the IC under test 190 or the MBIST controller 170, using a scan pattern that is very similar to a reset scan sequence. Such ease of SRAM testing during bring up means SRAM test and characterization can be done with far less effort, shortening bring up time.

In some embodiments, the march controller 110 is implemented as a state machine, or other circuit, having circuit structures, such as flops, registers, and sub-circuits. The march controller 110 can calculate and provide values for each march of various read-write-read elements and other marches of a particular march algorithm (e.g., the 27N algorithm described above). Conventionally, using MBIST controllers 170 can involve programming one scan pattern at a time apply and then applying a single march element at a time. For the illustrative 27N test, such a conventional approach can involve nine scan loads, each with the appropriate programming for each SRAM under test and with the corresponding programming delay.

In contrast, embodiments of the march controller 110 can be coupled with the MBIST controller 170, and a march data loader circuit 120 of the march controller 110 can effectively compute and apply all the test patterns for the IC under test 190. As illustrated, the march data loader circuit 120 is coupled with a march select register 140 and a march data store 130. As described above, each march algorithm typically includes a set of march elements (e.g., nine march elements for the illustrative 27N march algorithm), and each march element includes one or more reads or writes. Data characterizing each march element of a march algorithm can be stored in the march data store 130. Embodiments of the march select register 140 can step through a predetermined number of march elements for the march algorithm, as stored in the march data store 130. The march data store can include any suitable storage, such as a set of registers, a read-only memory, a programmable memory, or the like. Each time the march select register 140 triggers a move to a next march element, data for that march element is loaded from the march data store 130 to the march data loader circuit 120, and the march data loader circuit 120 generates a march element output signal by which to program the MBIST controller 170.

For example, the illustrative 27N algorithm has nine marches. According to one implementation, the march select register 140 is a 9-bit, non-encoded register implemented with a one-hot design. In another implementation, the march select register 140 is a 4-bit register implemented to encode the nine march element indices. Over the course of running the march algorithm, the march select register 140 steps through the nine bits of its register (e.g., 0:8), each time effectively indexing a different set of stored data for the corresponding march element. For example, after the MBIST controller 170 is initialized using an all '0's pattern, the march controller 110 effectively feeds the programming values to the MBIST controller 170 for the nine march elements.

For each march element, the march data loader circuit 120 can load data from the march data store 130 and can compute values to output for programming of the MBIST controller 170. The generated march data output signal can include any suitable values. In some embodiments, each march element is encoded in the output signal to indicate some or all of the following: march element length, address increment, address star, read-enable sequence for current march, write-enable sequence for current march, data inversion sequence for current march, and up/down count order for current march. As one example, 36 bits are used to encode the march sequence in the output signal as follows: march element length (bits 0-4), address increment (bits 5-10), address star (bits 11-16), read-enable sequence for current march (bits 17-22), write-enable sequence for current march (bits 23-28), data inversion sequence for current march (bits 29-34), and up/down count order for current march (bit 35). Some or all of these values can be specified and programmed by the march data loader circuit 120 for each march according to data stored in the march data store 130, and can be communicated to the MBIST controller 170 for decoding into a sequence of scan data to be shifted into the IC under test 190.

In some embodiments additional structures can be provided for additional scan test functionality. One such optional structure is a flop (e.g., "mix_address") to apply a re-ordered addressing to the IC under test 190 during each march. Another such optional structure is a flop ("checkerboard") to apply alternating n/p patterns to odd and even addresses. In some embodiments, these and/or other options flops (e.g., the mix_address flop, the checkerboard flop, a data_in programming flop, a MISR seed value programming flop, etc.) can be implemented as part of the MBIST controller 170 that applies the test patterns to the IC under test 190. For example, such optional structures are illustrated as optional flops 175.

Some embodiments include additional components. For example, the march controller 110 can include a delay register 145 that controls and delays loading of a next march value until a current march test ends. In some cases, the march address reaches an end while the march test is still active, and the delay register 145 can permit the current march to be completely applied. Some implementations of the delay register 145 include a 10-bit register and logic to provide a particular duration of delay. Other implementations can use a register of a different size, a different type of delay element, more complex delay logic, programmable delay logic, or other components to effect the delay. Some embodiments can also include an additional structures for controlling timing. For example, one flop can detect an initial clock after a scan load finishes, one flop can delay a stop signal to turn off writes and reads after a last address is tested, and/or one flop can delay a pre-decoded march value load to reduce timing paths.

Figure 2:
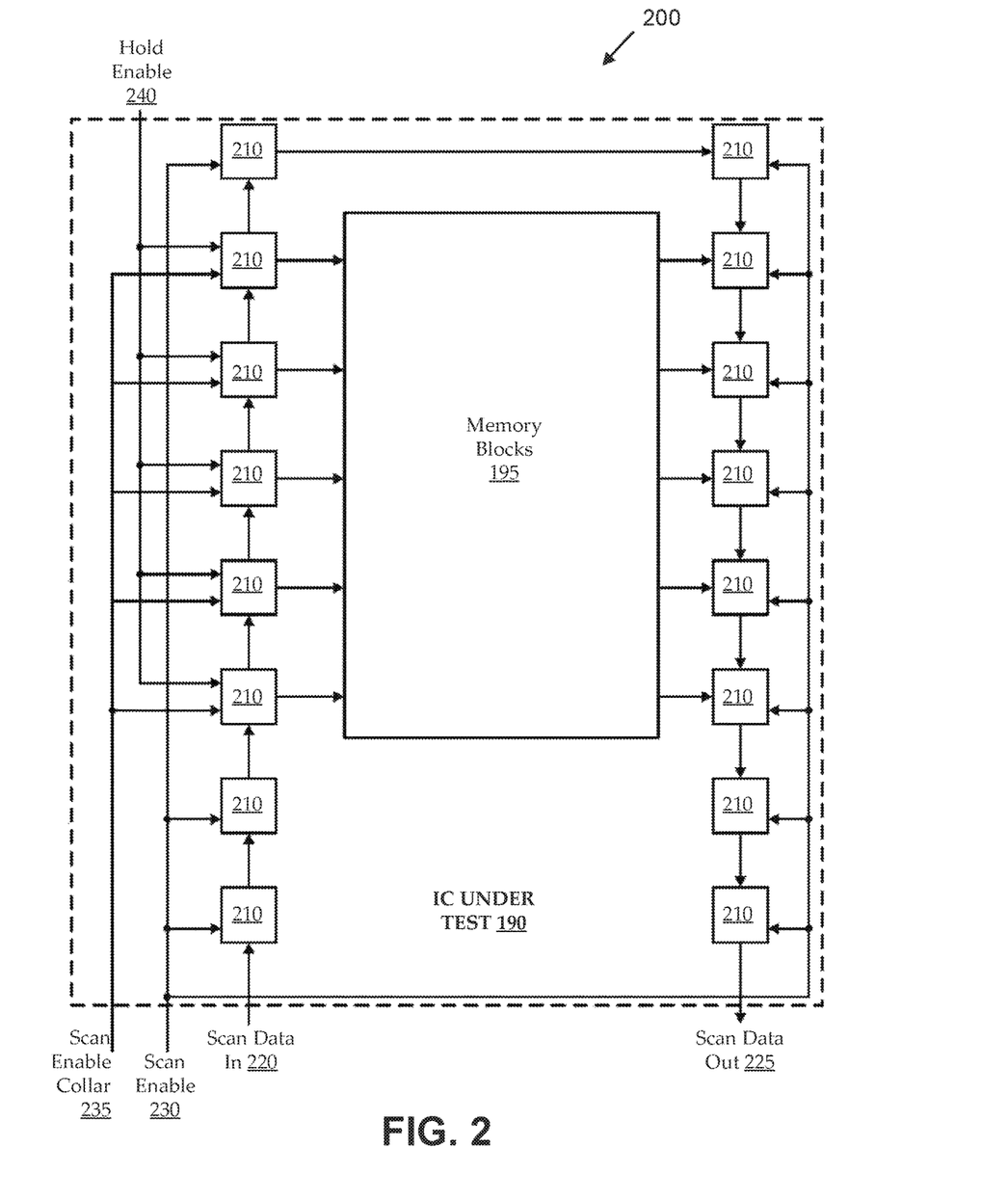
FIG. 2 shows a simplified block diagram of an illustrative IC under test, as context for various embodiments.

FIG. 2 shows a simplified block diagram 200 of an illustrative IC under test 190, as context for various embodiments. The IC under test 190 can be any suitable type of integrated circuit having blocks suitable for scan-based testing. For example, the IC under test 190 can be a processor, and the blocks under test 195 can form a cache memory having an array of memory blocks. The IC under test 190 can include one or more internal scan chains (e.g., including scan elements 210), such that it is configured for scan testing. As described with reference to FIG. 1, the march data loader circuit 120 of the march controller 110 can load march data into the MBIST controller 170, from which the MBIST controller 170 can generate test stimulus data (a scan pattern). The test stimulus data can be input to the IC under test 190 (e.g., bit-by-bit) via a scan data in input 220. The test stimulus data is shifted in, or otherwise serially input, into blocks under test 195 (e.g., SRAM blocks) in accordance with the scan chain of the IC under test 190. Structures of the blocks under test 195 respond to the test stimulus data and generate response data. The response data can be captured by shifting the data out of the IC under test 190, and the captured response data can be output to the MBIST controller 170 via a scan data out output 225. The MBIST controller 170 can analyze the response data (e.g., against a predetermined template, expected response, etc.) to determine whether the IC under test 190 passes or fails the test.

As illustrated, the IC under test 190 can include scan elements 210. Each scan element 210 can be implemented as a multiplexer coupled to a D flip-flop, as a LSSD (level sensitive scan design) element, or in any other suitable manner. During normal operation (i.e., not during scan-based testing), some scan elements 210 (e.g., those on an input side of the memory blocks) can provide an input path for data input into the memory blocks, and other scan elements 210 (e.g., those on an output side of the memory blocks) can provide an output path for data output from the memory blocks. The scan elements 210 coupled to the memory blocks can be considered as forming a "collar." During scan-based testing, the test stimulus data can similarly be input into the IC under test 190 via the scan chain by serially shifting bits from one scan element 210 to the next via the scan data in input 220; and response data can be captured by various ones of the scan elements 210 and shifted from the IC under test 190 via the scan chain by serially shifting bits from one scan element to another onto the scan data out output 225.

Each scan element 210 is illustrated as coupled to receive a scan enable signal 230, which can effectively enable the scan elements 210 during shift operations. During scan-based testing, the scan enable signal 230 can be de-asserted, a clock pulse can be provided to convey the test stimulus data from various ones of the scan elements 210 to logic circuits (not shown), and another clock pulse can be provided to enable various ones of scan elements 210 to capture the response data. After the response data has been captured, the scan enable signal 220 can be re-asserted, and the response data can be shifted out of the IC under test 190 to the MBIST controller 170. Some scan elements 210 can be coupled with a scan enable collar signal 235 that is separate from the scan enable signal 230 provided to others of the scan elements 210, thereby permitting a subset of the scan elements 210 to remain asserted during the entire scan-based testing operation, even while the scan enable signal 230 is de-asserted. Embodiments of the scan elements 210 can also be coupled to other signal ports, such as write port, address inputs, control signal inputs, etc. Some implementations are coupled with a hold enable signal 240 that can permit data from output of one or more scan elements 210 to be re-circulated back to the input of the one or more scan elements 210. This can enable a scan element 210 to be loaded with test stimulus data for a single instance, while providing the test stimulus data to the blocks under test 195 for multiple clock cycles. Such an approach can enable scan-based testing of the blocks under test 195 to be performed at the operational clock speed of the blocks under test 195 over a number of clock cycles (e.g., at a highest, nominal, or other clock speed or frequency at which the IC under test 190 is configured to operate during normal operation).

Figure 3:
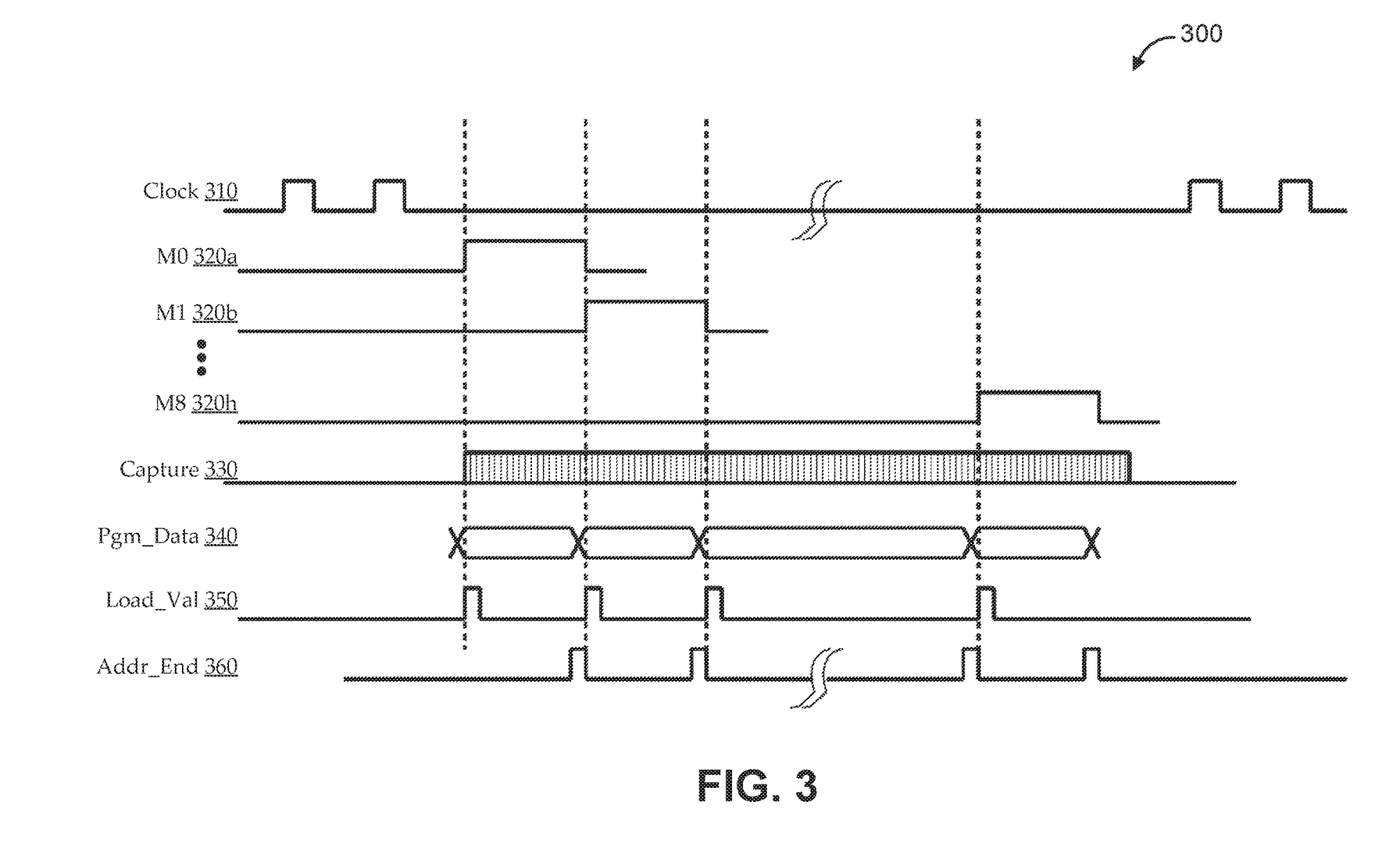
FIG. 3 shows simplified timing diagrams for illustrative scan-based testing, according to various embodiments.

FIG. 3 shows simplified timing diagrams 300 for illustrative scan-based testing, according to various embodiments. The timing diagrams represent a single scan pattern (e.g., for the 27N pattern described above) and are not intended to show scale. A "Clock" waveform 310 represents an illustrative clock output signal used for execution of the scan-based testing procedure. For example, the "Clock" waveform 310 can be generated by a system clock, a phase-locked loop, and/or in any other suitable manner. As described with reference to FIG. 1, a march select register 140 can step through bits (or bit codes) to select each of a sequence of different sets of stored data for each corresponding march element in order. For example, the march select register 140 can be a 9-bit register for selecting each of 9 march elements of the 27N pattern. In a one-hot implementation, or the like, each of an "M0" signal 320a through an "M8" signal 320h can be asserted for some amount of time, in sequence, during which the corresponding march element data can be selected (e.g., from a march data store 130) and loaded (e.g., by a march data loader circuit 120) to the MBIST controller 170.

For each march element in the pattern, a "Load_Val" signal 350 and an "Addr_End" signal 360 can be asserted at the start and end, respectively, of loading values for the particular march element. For example, the "Load_Val" signal 350 can be asserted, which can cause the indexed set of values for the particular march element to be loaded from the march data loader circuit 120 to the MBIST controller 170, as indicated by the "Pgm_Data" signal 240; and the "Addr_End" signal 360 to indicate the end of loading the values for that march element. Also, during the scan-based testing procedure, response data is captured, as represented by the "Capture" signal 230. After data loading for the final march element has completed, the loaded data will continue to propagate (e.g., shift) through the IC under test 190, such that the "Capture" signal 230 indicates that response data continues to be captured after the "M8" has been de-asserted. Some implementations can use a delay register signal, and/or other signals to address timing, delays, or other characteristics of the scan-based testing procedure.

Figure 4:
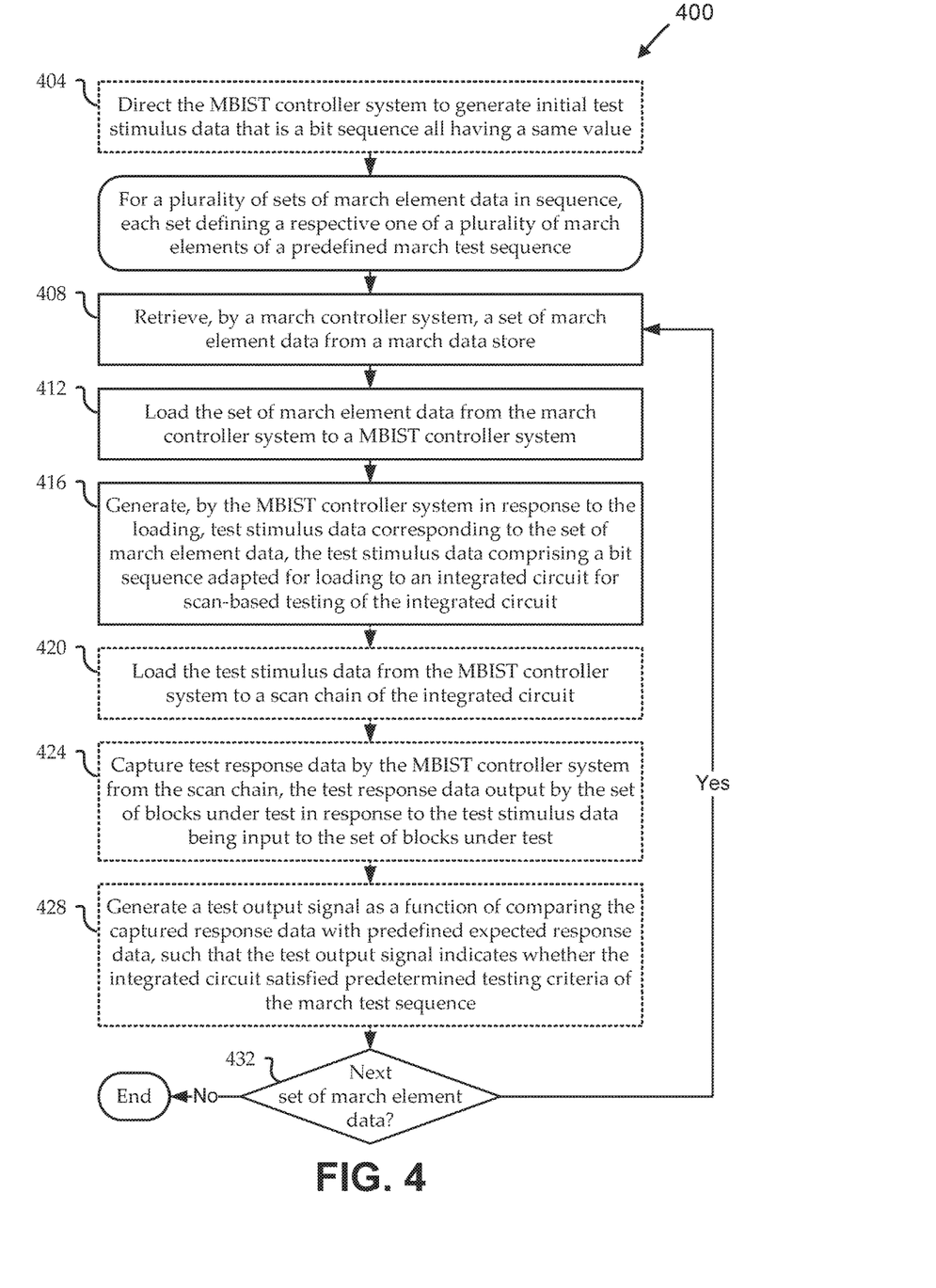
FIG. 4 shows a flow diagram of an illustrative method for scan-based testing of an integrated circuit, according to various embodiments.

FIG. 4 shows a flow diagram of an illustrative method 400 for scan-based testing of an integrated circuit, according to various embodiments. Embodiments of the method 400 iteratively perform steps for each of multiple sets of march element data in a sequence. Each set defines a respective one of a multiple march elements of a predefined march test sequence (e.g., the 27N sequence defined above), such that iteratively performing the steps for all the sets of march element data effectively generates the entire march test sequence. As discussed above, prior to beginning the march test sequence, some embodiments can initialize using a sequence of all '0's (or all '1's). For example, some embodiments can begin at stage 404 by directing (e.g., by a march controller system) a memory built-in self-test (MBIST) controller system to generate initial test stimulus data comprising a bit sequence all having a same value.

Some embodiments can iteratively perform stages 408-416. Such embodiments begin at stage 408 by retrieving (e.g., by the march controller system) the set of march element data (for the iteration) from a march data store. In some implementations, each iterative retrieving is performed by selecting a next index of a sequence of indices, each index pointing to a respective one of the sets of march element data in the march data store. The march data store can be any suitable memory, such as a non-transient memory. Some implementations of the memory are programmable. For example, some embodiments of the method 400 can include receiving programming instructions to program at least a portion of the sets of march element data via a programming interface of the march controller system.

At stage 412, embodiments can load the set of march element data from the march controller system to the MBIST controller system. As described above, some implementations of the sets of march element data can each define (for its respective march element) some or all of a march element length, an address increment, a read-enable sequence, a write-enable sequence, a data inversion sequence, and an up/down count order for the respective march element. Other implementations can include additional definitions, such as an address star, etc. At stage 416, embodiments can generate, by the MBIST controller system in response to the loading at stage 412, test stimulus data corresponding to the set of march element data. The test stimulus data includes a bit sequence adapted for loading to an integrated circuit for scan-based testing of the integrated circuit. In some embodiments, after stage 416, a determination can be made at stage 432 as to whether there are additional march elements store as part of the march test sequence. If so, the method 400 can return to stage 408 to iterate for the next march element in the sequence. If not, the method 400 can end.

In some embodiments, each iteration includes additional stages. For example, in each iteration, after stage 416, some embodiments continue at stage 420 by loading the test stimulus data from the MBIST controller system to a scan chain of an integrated circuit. The scan chain can have serially coupled scan elements, and a first portion of the scan elements can be coupled to provide signals for input into a set of blocks under test of the integrated circuit (e.g., SRAM, or other memory blocks). At stage 424, embodiments can capture test response data by the MBIST controller system from a second portion of the scan elements coupled to provide signals for output from the set of blocks under test. The test response data is output by the set of blocks under test in response to the test stimulus data being input to the set of blocks under test. Some embodiments can, at stage 428, generate a test output signal as a function of comparing the captured response data with predefined expected response data. The test output signal can indicate whether the integrated circuit satisfied predetermined testing criteria of the march test sequence (e.g., whether the integrated circuit passed or failed the test).

In some embodiments, each iteration begins only after ensuring that the previous iteration has completed. For example, the method 400 can further include determining completion of at least a portion of performing the capturing associated with each iteratively generating, so that the retrieving in each iteration is performed in response to the determining (i.e., after at least a portion of the response data has been captured from the previous iteration). In some such embodiments, the determining includes receiving a signal by the march controller system from the MBIST controller system indicating the completion. In other such embodiments, the determining includes delaying each iteratively retrieving by a predetermined amount of time associated with the completion (e.g., using a delay register, clock, etc.).

The methods disclosed herein include one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A system for scan-based testing of an integrated circuit, the system comprising:
   a march controller comprising:
      a march data store having, stored thereon, a plurality of sets of march element data, each defining a respective one of a plurality of march elements of a predefined march test sequence defining with a single scan pattern an entire march test;
      a march select register coupled with the march data store to select each set of march element data from the march data store according to the predefined march test sequence; and
      a march data loader coupled with the march select register to iteratively and sequentially output each set of march element data selected by the march select register; and
   a memory built-in self-test (MBIST) control processor coupled with the march controller to generate, in response to receiving each set of march element data output by the march controller, test stimulus data corresponding to the received set of march element data, the test stimulus data comprising a bit sequence adapted for loading to the integrated circuit for the scan-based testing.

2. The system of claim 1, wherein the MBIST control processor is further coupled with the integrated circuit.

3. The system of claim 2, wherein the MBIST control processor further operates to:
   load the test stimulus data to a scan chain of the integrated circuit, the scan chain having a plurality of serially coupled scan elements, a first portion of the scan elements coupled to provide signals for input into a set of blocks under test of the integrated circuit; and
   capture test response data from a second portion of the scan elements coupled to provide signals for output from the set of blocks under test, the test response data output by the set of blocks under test in response to the test stimulus data being input to the set of blocks under test.

4. The system of claim 3, wherein the MBIST control processor further operates to generate a test output signal as a function of comparing the captured response data with predefined expected response data, such that the test output signal indicates whether the integrated circuit satisfied predetermined testing criteria of the march test sequence.

5. The system of claim 3, wherein the march select register operates, for each of a plurality of iterations each corresponding to a respective one of the march elements, to select a corresponding one of the sets of march element data from the march data store in response to receiving an indication of completion of performing at least a portion of the capturing associated with the preceding iteration.

6. The system of claim 5, wherein the indication is according to a signal received by the march controller from the MBIST control processor, the signal generated by the MBIST control processor in accordance with detecting the completion of performing at least the portion of the capturing associated with the preceding iteration.

7. The system of claim 5, wherein the march controller further comprises a delay register that outputs the indication in response to detecting passage of a predetermined amount of time associated with the completion.

8. The system of claim 1, wherein the march controller further operates to direct the MBIST controller system to generate initial test stimulus data comprising a bit sequence all having a same value.

9. The system of claim 1, wherein the march controller further comprises:
   a march programmer coupled with the march data store and a programming interface to receive programming instructions to program at least a portion of the plurality of sets of march element data.

10. The system of claim 1, wherein each set of march element data defines a march element length for the respective march element, an address increment for the respective march element, a read-enable sequence for the respective march element, and a write-enable sequence for the respective march element.

11. The system of claim 1, wherein the entire march test is a 13N march test, a 14N march test, or a 27N march test.

12. The system of claim 1, wherein the scan-based testing is performed without requiring identifying of any flop positions of individual blocks under test in the integrated circuit.

13. The system of claim 1, wherein the march controller provides a multiple input shift register (MISR) seed value only once for all marches performed during the scan-based testing by the MBIST control processor.

14. A method for scan-based testing of an integrated circuit, the method comprising:
   iteratively, for each of a plurality of sets of march element data in sequence, each set defining a respective one of a plurality of march elements of a predefined march test sequence defining with a single pattern with all march elements of a march test:
      retrieving, by a march controller system, the set of march element data from a march data store;
      loading the set of march element data from the march controller system to a memory built-in self-test (MBIST) controller system; and
      generating, by the MBIST controller system in response to the loading, test stimulus data corresponding to the set of march element data, the test stimulus data comprising a bit sequence adapted for loading to an integrated circuit for scan-based testing of the integrated circuit,
   such that performing the iteratively generating for all the sets of march element data generates all of the march test sequence.

15. The method of claim 14, further comprising:
   loading the test stimulus data from the MBIST controller system to a scan chain of the integrated circuit, the scan chain having a plurality of serially coupled scan elements, a first portion of the scan elements coupled to provide signals for input into a set of blocks under test of the integrated circuit; and
   capturing test response data by the MBIST controller system from a second portion of the scan elements coupled to provide signals for output from the set of blocks under test, the test response data output by the set of blocks under test in response to the test stimulus data being input to the set of blocks under test.

16. The method of claim 15, further comprising:
   generating a test output signal as a function of comparing the captured response data with predefined expected response data, such that the test output signal indicates whether the integrated circuit satisfied predetermined testing criteria of the march test sequence.

17. The method of claim 15, further comprising:
determining completion of performing at least a portion of the capturing associated with each iteratively generating,
wherein each iteratively retrieving is performed in response to the determining.

18. The method of claim 17, wherein the determining comprises receiving a signal by the march controller system from the MBIST controller system indicating the completion.

19. The method of claim 17, wherein the determining comprises delaying each iteratively retrieving by a predetermined amount of time associated with the completion.

20. The method of claim 14, further comprising:
directing, by the march controller system prior to the retrieving, the MBIST controller system to generate initial test stimulus data comprising a bit sequence all having a same value.

21. The method of claim 14, wherein the retrieving comprises selecting a next index of a sequence of indices, each index pointing to a respective one of the plurality of sets of march element data in the march data store.

22. The method of claim 14, further comprising:
receiving programming instructions to program at least a portion of the plurality of sets of march element data via a programming interface of the march controller system.

23. The method of claim 14, wherein each set of march element data defines a march element length for the respective march element, an address increment for the respective march element, a read-enable sequence for the respective march element, and a write-enable sequence for the respective march element.

* * * * *

UNITED STATES PATENT AND TRADEMARK OFFICE
CERTIFICATE OF CORRECTION

PATENT NO. : 10,408,876 B2
APPLICATION NO. : 15/882674
DATED : September 10, 2019
INVENTOR(S) : Ziaja et al.

Page 1 of 1

It is certified that error appears in the above-identified patent and that said Letters Patent is hereby corrected as shown below:

In the Specification

In Column 5, Line 40, delete "time apply" and insert -- time --, therefor.

Signed and Sealed this
Eighth Day of September, 2020

Andrei Iancu
*Director of the United States Patent and Trademark Office*